United States Patent
Paietta et al.

(10) Patent No.: US 10,816,573 B2
(45) Date of Patent: Oct. 27, 2020

(54) ENHANCED MOUNTING SYSTEM FOR PANEL MOUNT TEST SWITCHES AND TEST BLOCKS

(71) Applicant: Fischer Block, Inc., Royersford, PA (US)

(72) Inventors: Margaret Paietta, Royersford, PA (US); Gregory Wolfe, Royersford, PA (US)

(73) Assignee: Fischer Block, Inc., Royersford, PA (US)

( * ) Notice: Subject to any disclaimer, the term of this patent is extended or adjusted under 35 U.S.C. 154(b) by 77 days.

(21) Appl. No.: 16/309,326

(22) PCT Filed: Jul. 10, 2017

(86) PCT No.: PCT/US2017/041341
§ 371 (c)(1),
(2) Date: Dec. 12, 2018

(87) PCT Pub. No.: WO2018/009929
PCT Pub. Date: Jan. 11, 2018

(65) Prior Publication Data
US 2019/0310285 A1    Oct. 10, 2019

Related U.S. Application Data

(60) Provisional application No. 62/359,956, filed on Jul. 8, 2016.

(51) Int. Cl.
*G01R 31/00*    (2006.01)
*G01R 1/04*    (2006.01)
*H01H 21/54*    (2006.01)

(52) U.S. Cl.
CPC .......... *G01R 1/0408* (2013.01); *H01H 21/54* (2013.01)

(58) Field of Classification Search
CPC .. G01R 1/0408; G01R 1/206; G01R 31/3278; G01R 15/142
See application file for complete search history.

(56) References Cited

U.S. PATENT DOCUMENTS 4,904,091 A * 2/1990 Ward ................. G01K 1/14
136/230
7,067,749 B1 * 6/2006 Cantolino ............. H01H 35/18
200/84 R (Continued)

FOREIGN PATENT DOCUMENTS

CN    102313261 A    1/2012
CN    204064489 U    12/2014

OTHER PUBLICATIONS

International Patent Application No. PCT/US17/41341, Notification of Transmittal of the International Search Report and the Written Opinion of the International Searching Authority dated Sep. 27, 2017, 8 pages.

*Primary Examiner* — Thang X Le
(74) *Attorney, Agent, or Firm* — Morgan, Lewis & Bockius LLP

(57) ABSTRACT

A mounting mechanism comprising: a first end and a second end; and a shaft extending from the first end to the second end, the shaft including: a peripheral wall; threading extending along at least a portion of the peripheral wall of the shaft; a first port hole opening and a second port hole opening; a through-hole extending from the first port hole opening to the second port hole opening to provide a via for wiring to pass within the shaft from the first port hole opening to the second port hole opening.

9 Claims, 22 Drawing Sheets

(56) References Cited

U.S. PATENT DOCUMENTS

| | | | | |
|---|---|---|---|---|
| 7,537,467 B1 * | 5/2009 | Gretz | ...................... | H01R 4/36 |
| | | | | 439/108 |
| 7,997,944 B1 | 8/2011 | Federowicz | | |
| 2005/0101177 A1 * | 5/2005 | Ray | ........................ | H01R 13/72 |
| | | | | 439/353 |
| 2010/0258345 A1 * | 10/2010 | Tiefenthaler | ........... | H02G 3/081 |
| | | | | 174/481 |
| 2012/0216791 A1 | 8/2012 | Munzenberger | | |
| 2014/0353987 A1 * | 12/2014 | Glover | ...................... | E05C 3/30 |
| | | | | 292/336.3 |
| 2015/0086293 A1 * | 3/2015 | Takakura | ............. | G02B 6/3624 |
| | | | | 411/337 |
| 2016/0033578 A1 | 2/2016 | Wolfe et al. | | |

* cited by examiner

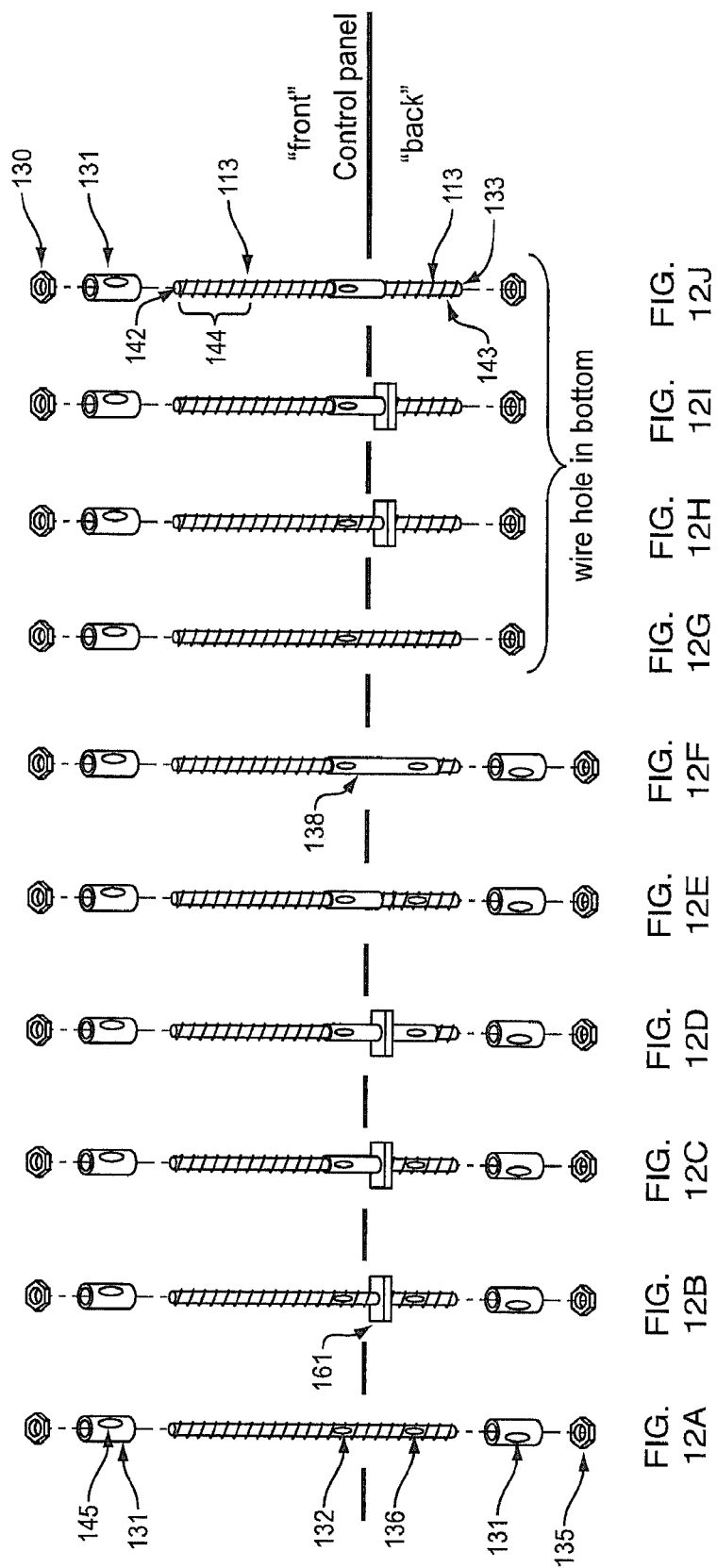

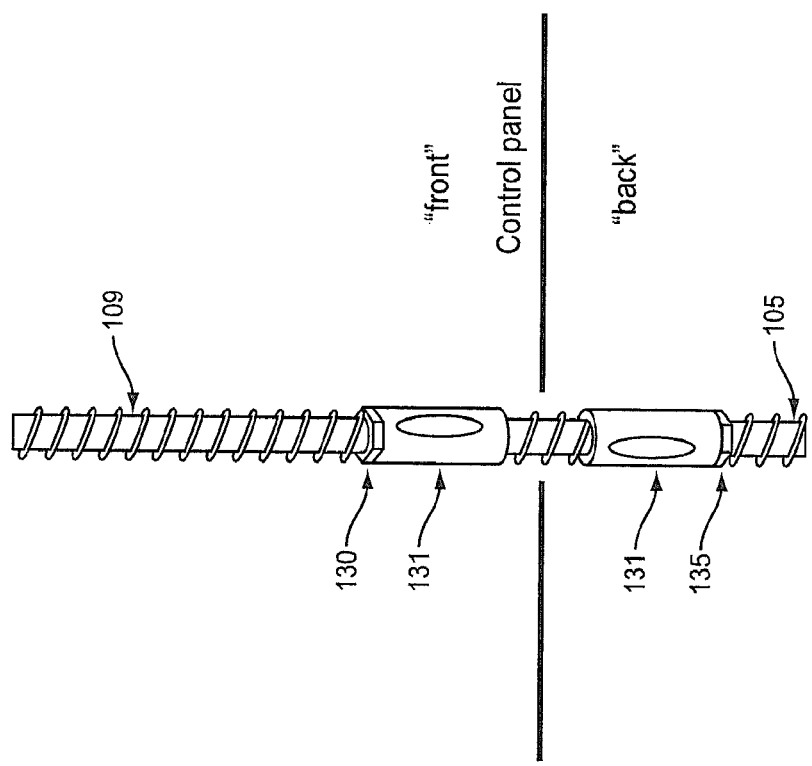

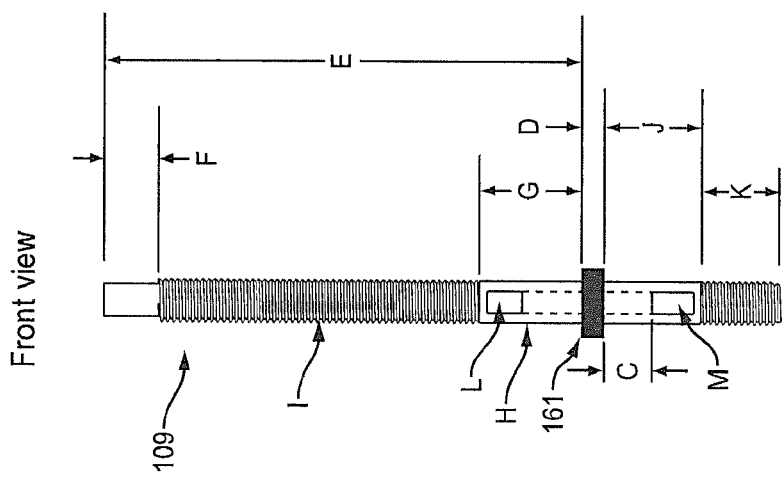
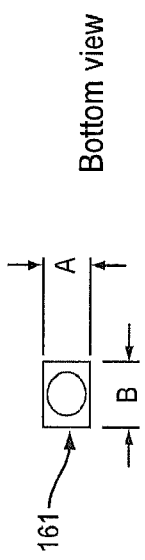
FIG. 14A
FIG. 14B

ENHANCED MOUNTING SYSTEM FOR PANEL MOUNT TEST SWITCHES AND TEST BLOCKS

CROSS-REFERENCE TO RELATED APPLICATIONS

This application is a National Stage Entry of International Patent Application No. PCT/US17/41341, filed on Jul. 10, 2017, which claims the benefit of U.S. Provisional Patent Application No. 62/359,956 filed Jul. 8, 2016 entitled "ENHANCED MOUNTING SYSTEM FOR PANEL MOUNT TEST SWITCHES AND TEST BLOCKS", incorporated by reference herein in their entireties.

BACKGROUND

Current electrical networks (e.g., a power grid) are generally comprised of a system of generators, wires and substations which typically generate electricity at generating plants (e.g., coal, solar, wind, etc.) and transmit and distribute the electricity to customers through substations and wires. Along the network of wires and substations are critical assets such as transformers, capacitors, circuit breakers, and the like.

Electronic recording devices are commonly used throughout an electrical grid to provide critical information to engineers and system operators on the health and performance of critical assets and of the grid in general. This information is typically in the form of electrical voltage and current signals, which can indicate looming problems with grid assets or provide diagnostic information as to why an outage may have occurred (and suggest possible courses of action to restore power quickly and safely).

Installing such recording devices is typically a difficult process for utility personnel, typically requiring panel shutdowns and rewiring of substation voltage and current wires during the installation process. This rewiring is required in order to route the signals of interest to one or more input ports on the recording device (for measuring and recording) and then back to the point(s) of origin in the grid circuit.

Thus, a simplified approach for the installation of recording devices used throughout an electrical grid is desired.

SUMMARY

These and other shortcomings of the prior art are addressed by embodiments disclosed herein, which provide for a simplified installation process of recording devices used on control panels throughout an electrical grid by utilizing a mechanism which aids in the physical mounting of such a recording device (or of the base or component to which such recording device mates) to one surface of a control panel, and also provides a means for safe and reliable passage of wires to an opposite surface of a control panel whereby such wires are used by the recording device for one or more of providing power to the recording device, communicating with one or more other devices, and for carrying other electrical signals to and/or from one or more other devices, including accessory components such as transducers.

On control panels throughout the electrical grid, it is desirable by grid operators for at least a portion of the installed recording devices to be positioned on the "front surface" of such control panels, so as to provide easy access by grid operators to features (such as buttons, switches, knobs, etc.) and/or information shown on displays, any or all of which is typically located on the front surface of such recording devices, while all or most of the wiring connected between such recording devices and other devices and/or components is safely and securely located on or in the vicinity of the "back surface" of the control panel (which is typically not accessible by grid operators during normal day-to-day operations).

In some instances, installation of a recording device onto a control panel includes having to cut one or more holes in the control panel to allow for at least a portion of the recording device to be positioned on one surface (or side) of a control panel, and at least portions of one or more other devices or components (to which the recording device must be connected to via wires, for normal operation) to be located on an opposite surface (or side) of the control panel.

Utilizing a mechanism which provides a means for both mounting a recording device (or base thereto) and also passing wires from one side of the control panel to the other, serves to minimize the number of holes which would otherwise need to be cut in a control panel when installing a recording device (or base thereto) onto a control panel.

Minimizing the number of holes which need to be cut in a control panel is desirable since cutting a hole in a control panel creates the deposition, onto the control panel and/or surrounding area, of numerous small metal shavings, the size of which makes many of such individual shavings difficult to see or detect with the naked eye or other means. Therefore, in such cases, it is common for one or more such shavings to go undetected and remain on the control panel and/or surrounding area even after carrying out a cleaning activity intended to remove all of such shavings. And, since such shavings are each electrically conductive, the undetected presence of even just one shaving poses a significant safety risk (to equipment and personnel) if such individual shaving were to come into contact with electrically energized circuits, the type which are common on control panels, as such contact could create undesirable and unsafe electrical paths between components and/or nodes within the electrical circuits, which are not intended to be electrically connected.

When installing recording devices which mount directly to panel-mount test switches or test blocks (such as the types disclosed in U.S. patent application Ser. No. 14/781,850 which is incorporated herein by reference in its entirety) with mounting mechanisms which provide a means to pass wires from one side of the panel to the other, allows users of such test switches and test blocks to take advantage of existing prefabricated mounting holes in the test switch and test block base and associated holes in the mating control panel, to run one or more wires, and such mechanisms thus serve to eliminate the need to cut even one additional hole in the control panel, beyond the one or more holes which are needed to aid in the mounting of such test switch or such test block to such control panel. And, in instances when such test switch or test block is already installed onto such control panel at the time when the installation of such recording device begins or is carried out, the use of such mechanism eliminates the need to cut even one hole in the control panel, when installing such recording device. This is a highly desirable condition for maintainers of electrical grid systems since such installations fully prevent the creation of metal shavings, and the risks such shavings present, as described herein, which would otherwise exist if such mechanism were not used.

BRIEF DESCRIPTION OF THE SEVERAL VIEWS OF THE DRAWINGS

The foregoing summary, as well as the following detailed description of embodiments of the invention, will be better understood when read in conjunction with the appended drawings of an exemplary embodiment. It should be understood, however, that the invention is not limited to the precise arrangements and instrumentalities shown.

In the drawings:

FIG. 7b illustrates the rear view of the test switch of FIG. 7a.

FIG. 12 illustrates several embodiments of a mounting mechanism which each are configured to pass wires from one side of a panel to the other, in accordance with at least some embodiments of the invention.

FIG. 13 illustrates an exemplary embodiment of a mounting mechanism which is configured to pass wires from one side of a panel to the other, in accordance with at least one embodiment of the invention.

FIGS. 14A-14B illustrate an exemplary mounting mechanism in accordance with at least one embodiment of the invention.

DETAILED DESCRIPTION

In order to simplify the installation process of recording devices used throughout an electrical grid, at least some embodiments are directed to a novel technique whereby a test switch or test block is physically and securely mounted (attached) to a control panel with a fastening system which also provides for safe and reliable passage of one or more wires from one surface of a control panel to an opposite surface of the control panel, with the purpose of such one or more wires being for carrying one or more electrical signals to and/or from a recording device operating on or near one surface of a control panel to one or more devices or components located on or near an opposing surface of such control panel.

Figure 1A:
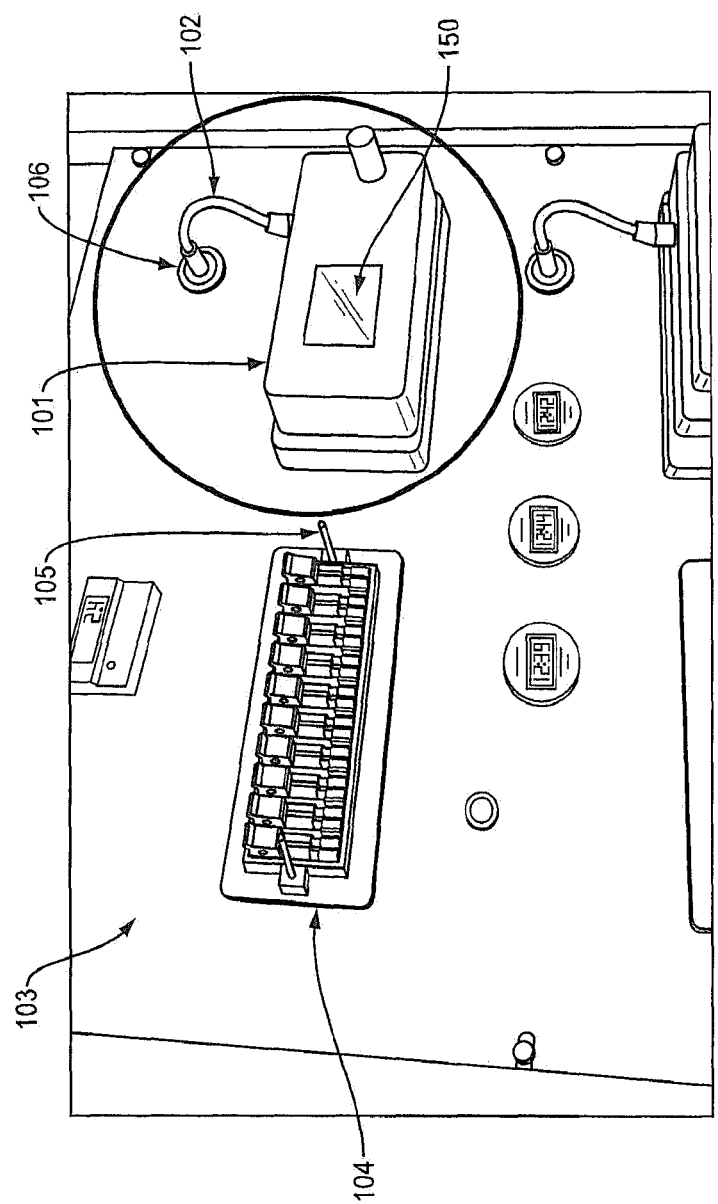
FIG. 1a illustrates a recording device configured to connect to a panel-mount type test switch similar to test switch on a control panel, via e.g., mounting mechanism.

FIG. 1a illustrates a recording device (101) (with display 150) configured to connect to a panel-mount type test switch similar to test switch (104) on a control panel (103), via e.g., mounting mechanism (105). Mounting mechanism (105) does not route wires internally. Therefore, the recording device (101) is connected to other devices and components such as transducers, power providing devices, computers, routers, servers, clocks, antennas, etc. (which are all located behind the control panel, 103) using wires (102) which pass through a panel-mount connector (106).

Figure 1B:
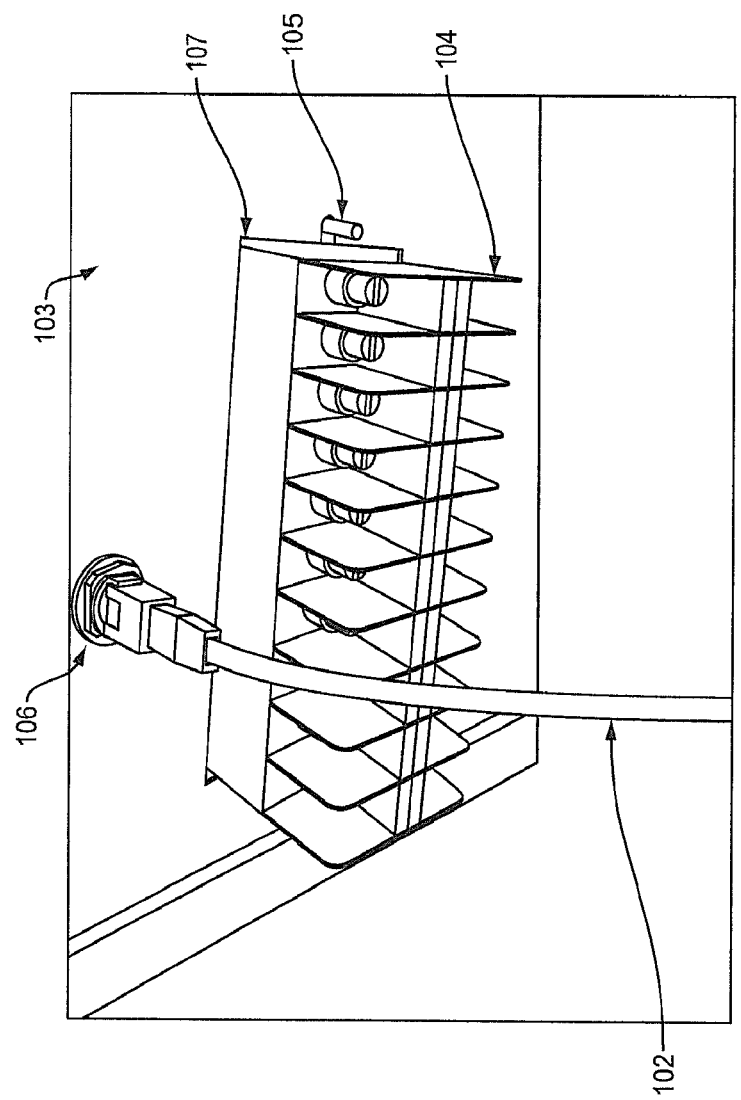
FIG. 1b illustrates the rear view of the control panel of FIG. 1a showing the rear portion of a test switch.

FIG. 1b illustrates the rear view of the control panel (103) of FIG. 1a showing the rear portion of a test switch (104). The test switch (104) utilizes a mounting mechanism (105) which does not provide a means for routing wires within the mounting mechanism (105) to secure the test switch (104) to the control panel (103). Also shown in FIG. 1b are insulated wires (102) which originate at more or more devices or components, such as such as transducers, power providing devices, computers, routers, servers, clocks, antennas, etc. and which pass through a panel-mount connector (106) and which further connect (on the front side of the control panel 103 as shown in FIG. 1a) to a recording device attached to the front portion of the test switch located on the front surface of the control panel.

Figure 2A:
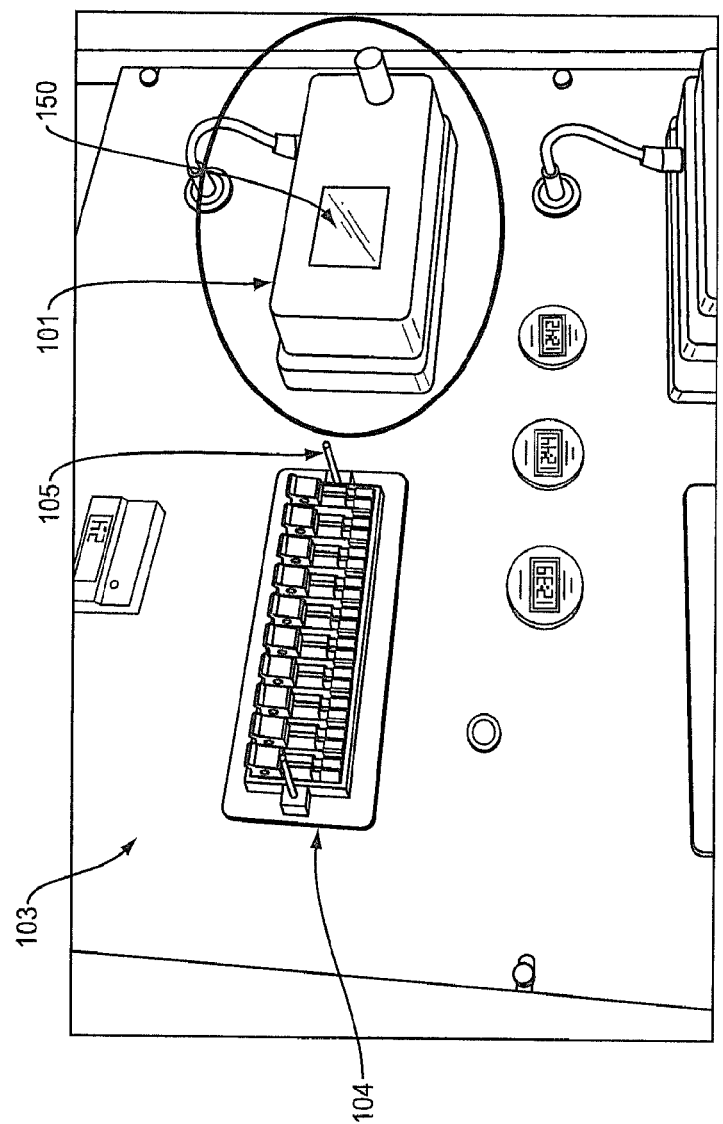
FIG. 2a illustrates a recording device, which connects to a panel-mount type test switch similar to test switch on a control panel via a mounting mechanism, in accordance with at least one embodiment of the invention.

FIG. 2a illustrates a recording device (101), which connects to a panel-mount type test switch similar to test switch (104) on a control panel (103) via a mounting mechanism (not shown but described in more detail below), in accordance with at least one embodiment of the invention. The recording device (101) is further connected to devices such as transducers, power providing devices, computers, routers, servers, clocks, antennas, etc. (which are located behind the control panel, 103) with wires which pass through an enhanced mounting mechanism (rather than through one or more panel mount connectors as shown in FIG. 1a) and thus avoiding the need for a panel-mount connector (and thus avoiding the need to cut a hole in the panel to which such panel-mount connector would otherwise mount).

Figure 2B:
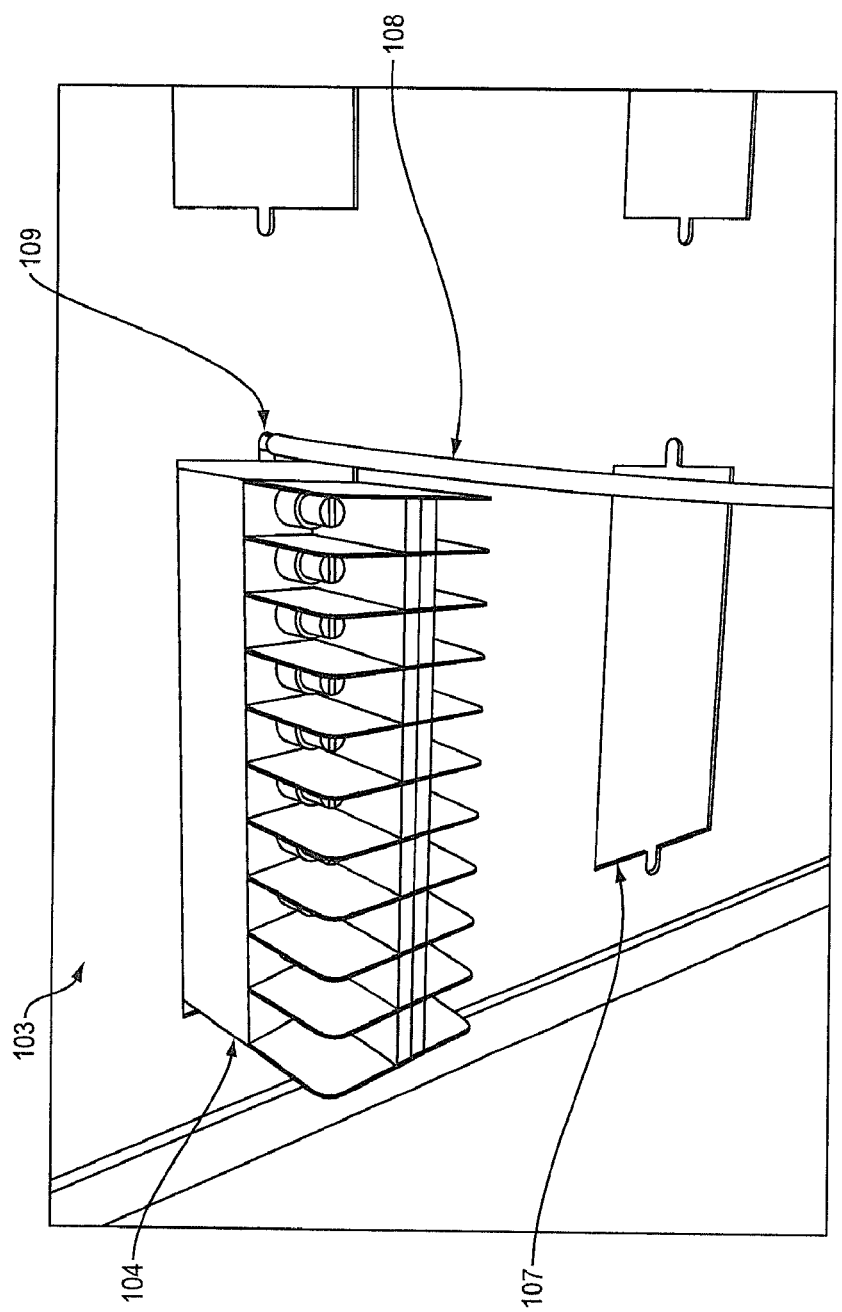
FIG. 2b illustrates the rear view of the control panel of FIG. 2a showing the rear portion of a test switch which utilizes a mounting mechanism to secure the test switch to the control panel, in accordance with at least one embodiment of the invention.

FIG. 2b illustrates the rear view of the control panel of FIG. 2a showing the rear portion of a test switch (104) which utilizes a mounting mechanism (109) to secure the test switch (104) to the control panel (103), in accordance with at least one embodiment of the invention. Mounting mechanism (109) is configured to pass wires from one side of the control panel (103) to the other side of the control panel (103). Also shown in this illustration are insulated wires (108) which originate at more or more devices or components, such as such as transducers, power providing devices, computers, routers, servers, clocks, antennas, etc. (not shown) and which pass through such mounting mechanism (109) to the front side of the control panel, 103 (as shown in FIG. 2a) and further connected to a recording device (101) (as shown in FIG. 2a) which is attached to the front side of the test switch (104).

Figure 3:
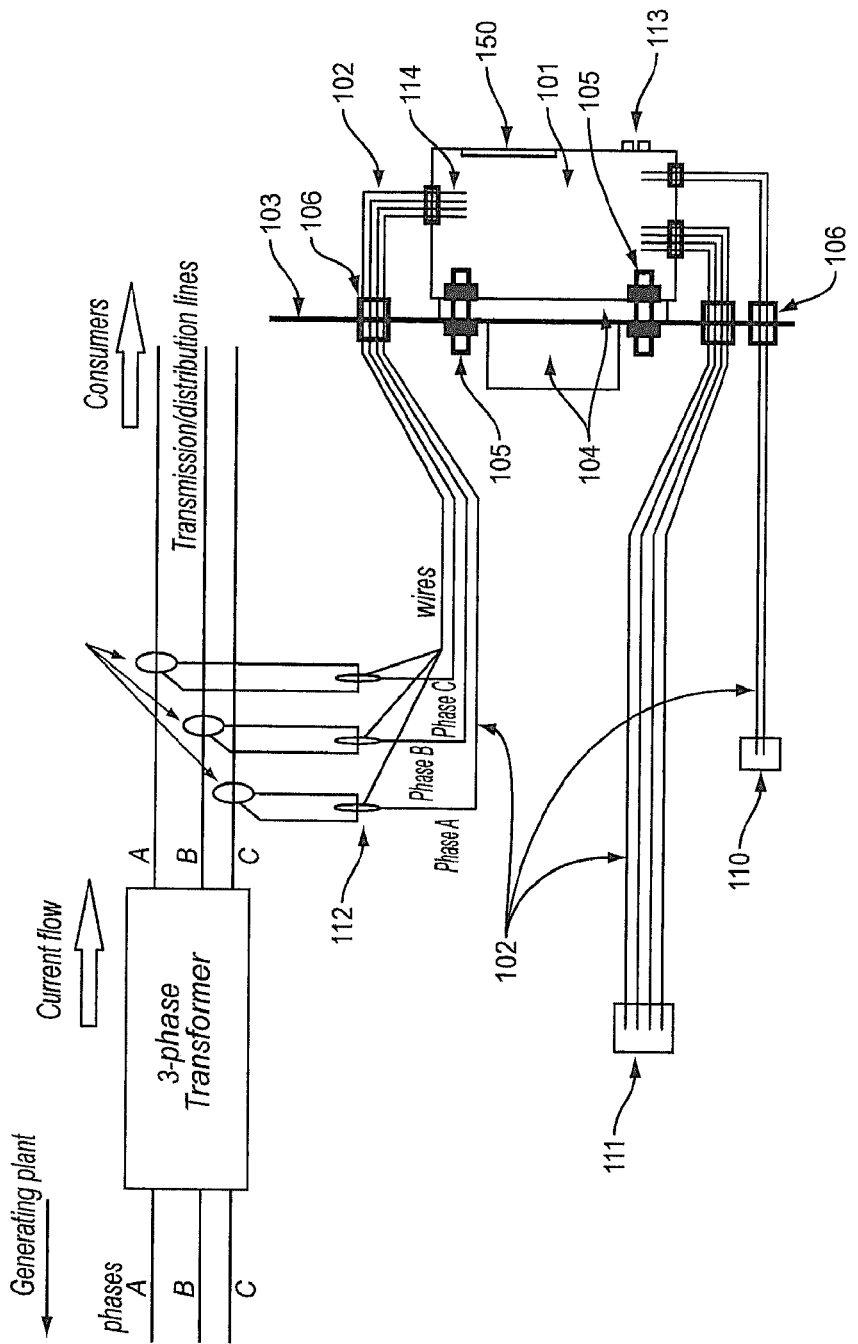
FIG. 3 is an electrical schematic diagram of a recording device which is connected to a panel-mount test switch.

FIG. 3 is an electrical schematic diagram of a recording device (101) which is connected to a panel-mount test switch (104). The recording device (101) is further connected with wires (102 and 114) to one or more other devices and components such as transducers (112), power providing devices (110), computers, routers, servers, clocks, antennas, etc. (111) which are located behind a control panel (103). This test switch (101) utilizes mounting mechanisms (each 105) which do not provide for routing wires within the mounting mechanisms (each 105) and thus, in order to pass the wires (102) from the recording device (101) to the other devices and components (e.g., power providing devices 110, antennas 111, transducers 112), as is typically required for normal operation of such a panel mount recording device (101), such wires (108) must pass through one or more panel mount connectors (106). And, each panel-mount connector (106) is mounted to the control panel, whereby the mounting of each such panel-mount connector (106) requires the use of one or more holes to be cut in the control panel (103), extending from the front surface of the control panel (103) to the opposite rear surface of the control panel (103).

Figure 4:
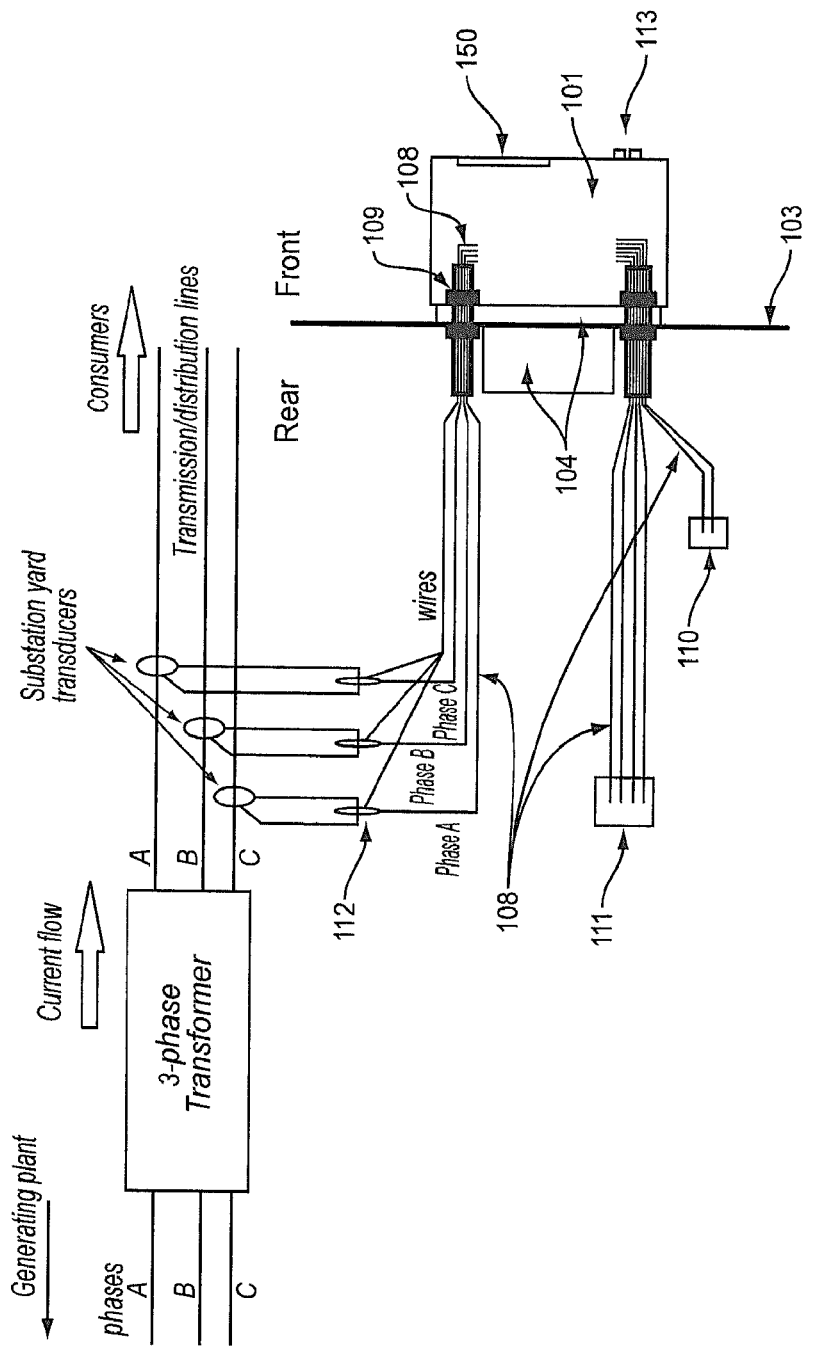
FIG. 4 is an electrical schematic diagram of a recording device which is connected to a panel-mount test switch, in accordance with at least one embodiment of the invention.

FIG. 4 is an electrical schematic diagram of a recording device (101) which is connected to a panel-mount test switch (104), in accordance with at least one embodiment of the invention. FIG. 4 illustrates an improvement on the mounting mechanism of FIG. 3 and shows an electrical schematic diagram of a recording device (101) which is connected to a panel-mount test switch (104) and further connected to other devices and components (such as transducers (112), power providing devices (110), computers, routers, servers, clocks, antennas, etc. (111) which are located behind a control panel (103b) with wires (108b and 116). However, unlike the test switch (101, of FIG. 3), the test switch (101) of FIG. 4 utilizes a mounting mechanism (109) which is configured to pass such wires (108) from the front surface of the control panel (103a) to the rear surface of the control panel (103b) without the need for any panel mount connectors (such as of the type shown in FIG. 3) and thus, eliminating the need for holes in the control panel (103) which would otherwise be needed to pass such wires (108) from the recording device (101) to other devices and components (e.g., power providing devices 110, antennas 111, transducers 112) as are typically required for normal operation of the recording device (101).

Figure 5:
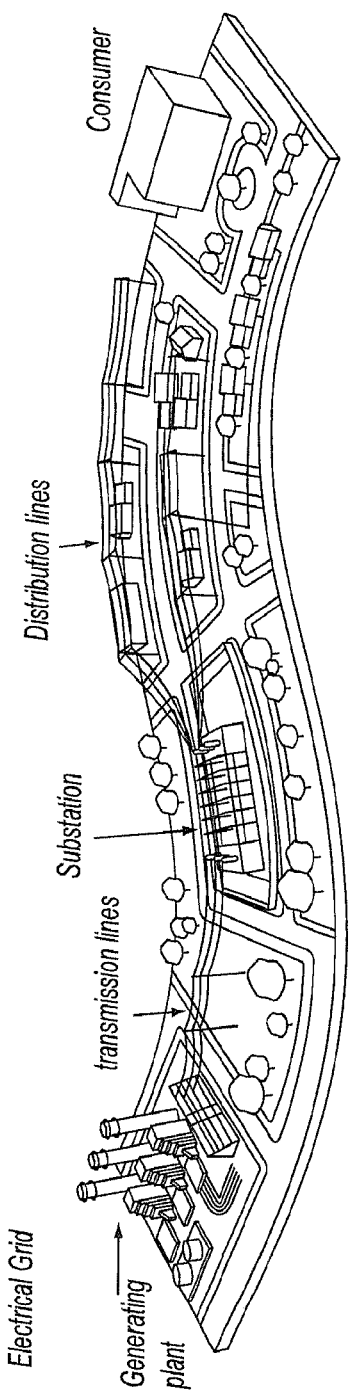
FIG. 5 illustrates components of an electrical grid in which recording devices are utilized, for example, at a substation.

FIG. 5 illustrates components of an electrical grid in which recording devices are utilized, for example, at a substation. As shown, generating plants are used to generate the electricity within electrical grid systems, in the form of voltage and current signals. Such electricity is then typically transmitted to substations via transmission and distribution lines. One of the primary roles of substations, along the grid, is to transform the voltage and current signals to levels which are appropriate for use by a consumer. It is within the substations shown which test switches and test blocks (and devices which house these devices) are typically utilized. However, it is contemplated that the test switches and test blocks may be utilized in other environments.

Figure 6:
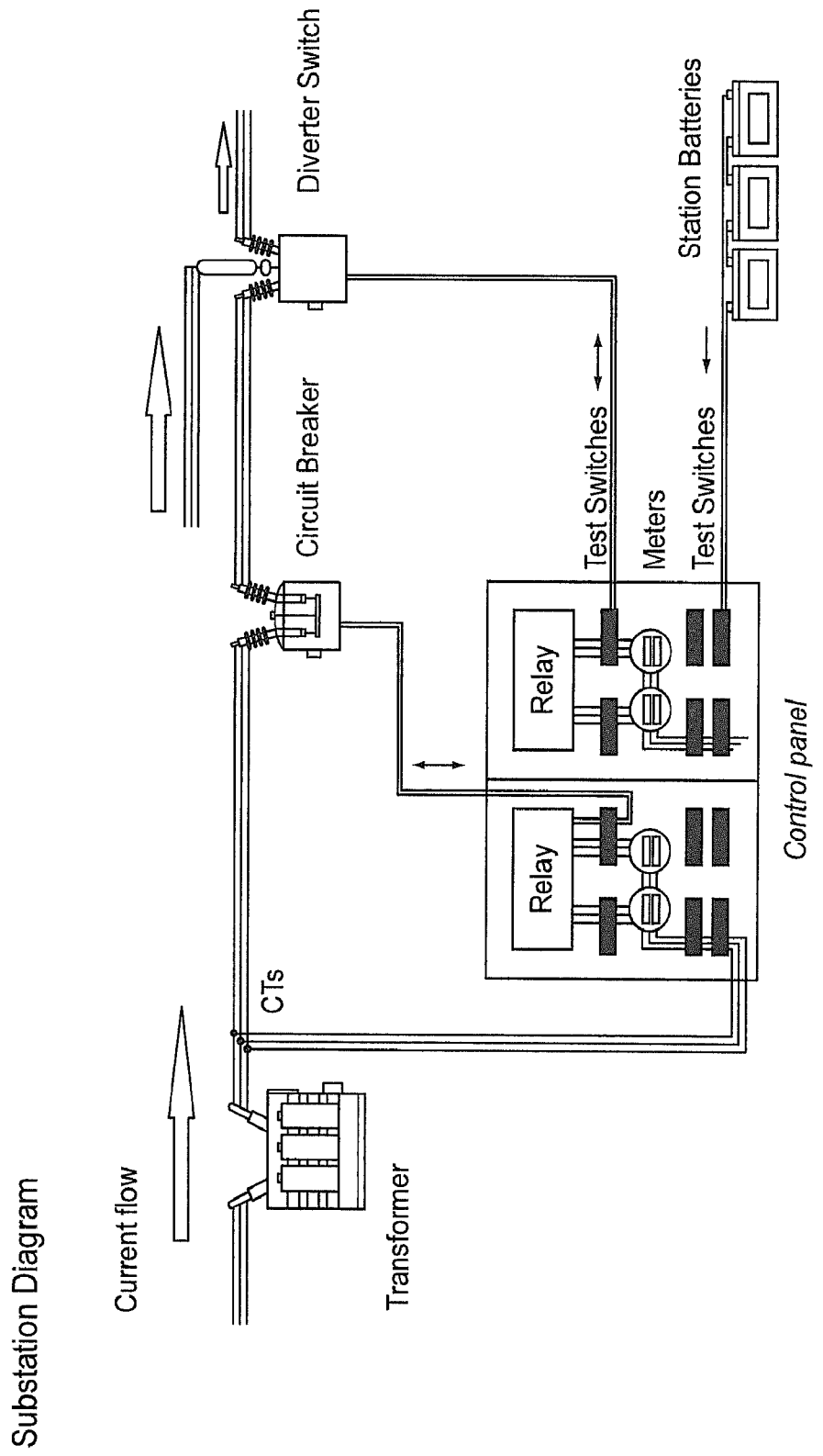
FIG. 6 illustrates features and components of a substation, including a control panel to which recording devices may be connected.

FIG. 6 illustrates features and components of a substation, including a control panel to which recording devices may be connected. Electricity flows from the upstream generating plant (not shown) through one or more transformers, circuit breakers, diverter switches and the like, and then on to the next substation and/or consumer premise. Typically found in substations are Potential Transformers (PTs, not shown) and Current Transformers (commonly referred to as CTs) which sense the voltage and current signals at or near the transformer terminals and which route signals (which are indicative of such sensed signals) on to control panels via wires which are typically connected through devices such as panel-mount test switches and test blocks (and/or through devices which contain these devices) for reading (via panel-mount meters) and processing and decision making purposes. Typical decisions (and which are typically made by panel-mount relays) are whether or not to activate or engage circuit breakers, diverter switches, capacitor banks (not shown), etc. It is also common in some applications for station battery signals to be run through test switches and test blocks.

Figure 7A:
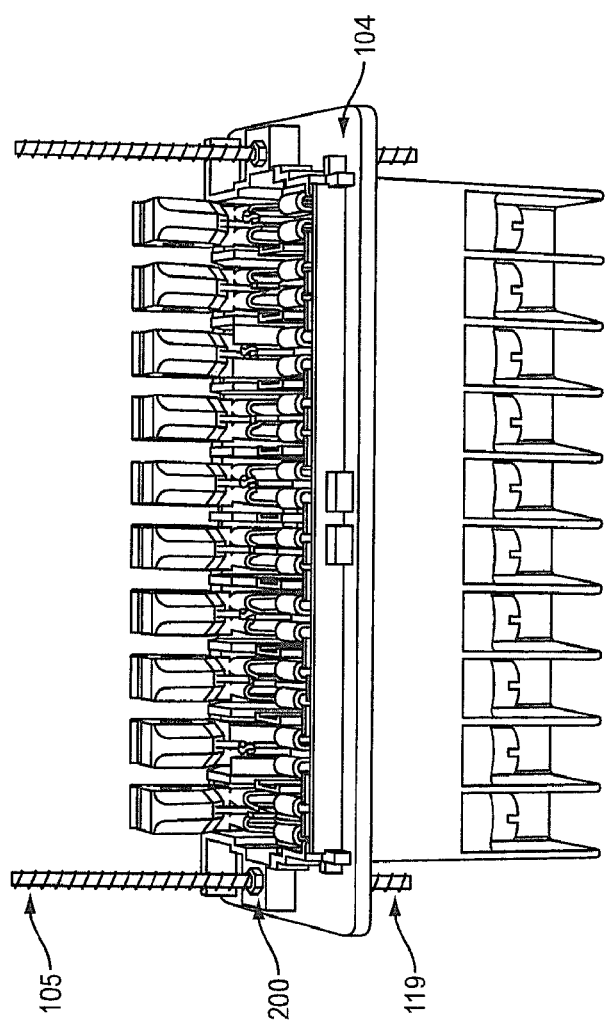
FIG. 7a illustrates a test switch.

FIG. 7a illustrates a test switch (104) similar to the type as described in U.S. patent application Ser. No. 14/781,850. The test switch (104) is configured to mount to a control panel using mounting mechanisms (e.g., mounting mechanism 105), each of which consist of a mounting screw (119) secured to a test switch (104) with a securing nut (200). Such mounting mechanisms are unable to pass wires from the front side of a control panel (to which test switch surface 104a mates) to the other side of a control panel (to which test switch surface 104b mates).

Figure 7B:
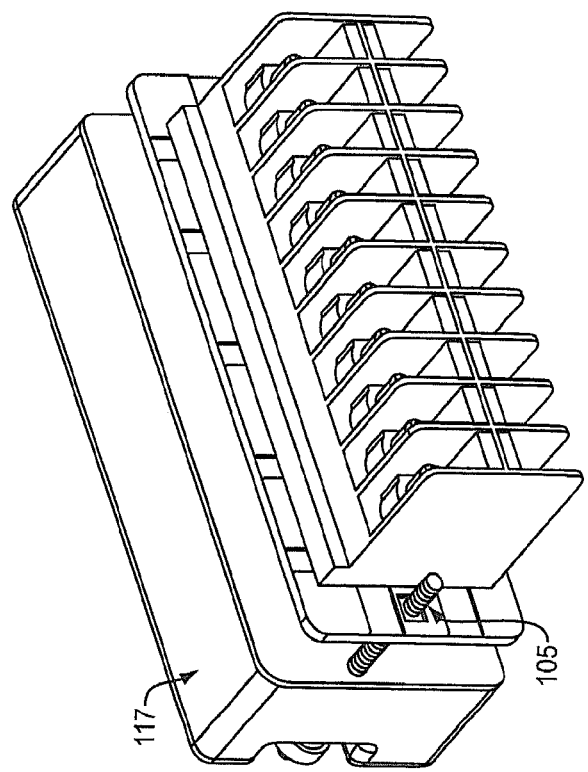

FIG. 7b illustrates the rear view of the test switch of FIG. 7a. Also shown is a recording device (117) which mounts to the test switch by means of the mounting mechanism (105) when installed onto such test switch.

Figure 8:
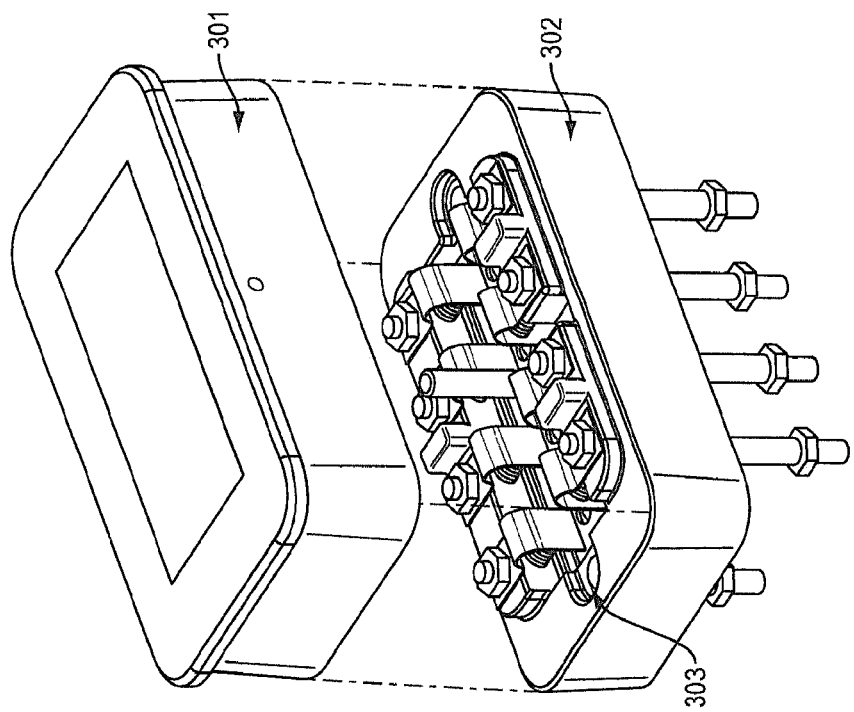
FIG. 8 illustrates a test block with mounting mechanism and recording device, in accordance with at least one embodiment of the invention.

FIG. 8 illustrates a test block (302) with mounting mechanism (303) and recording device (301), the types of which are as disclosed in U.S. patent application Ser. No. 14/781,850, in accordance with at least one embodiment of the invention. Similar to a panel-mount test switch, a test block (302) also contains electrical signals which are also of interest to grid operators (as shown in FIG. 6) and users of such test blocks (302) can also achieve the benefit of mounting recording devices to such test blocks, without having to cut holes in the control panel, when mounting mechanisms are configured to pass wires through the control panel are utilized to mount such test blocks (302) to control panels.

Figure 8A:
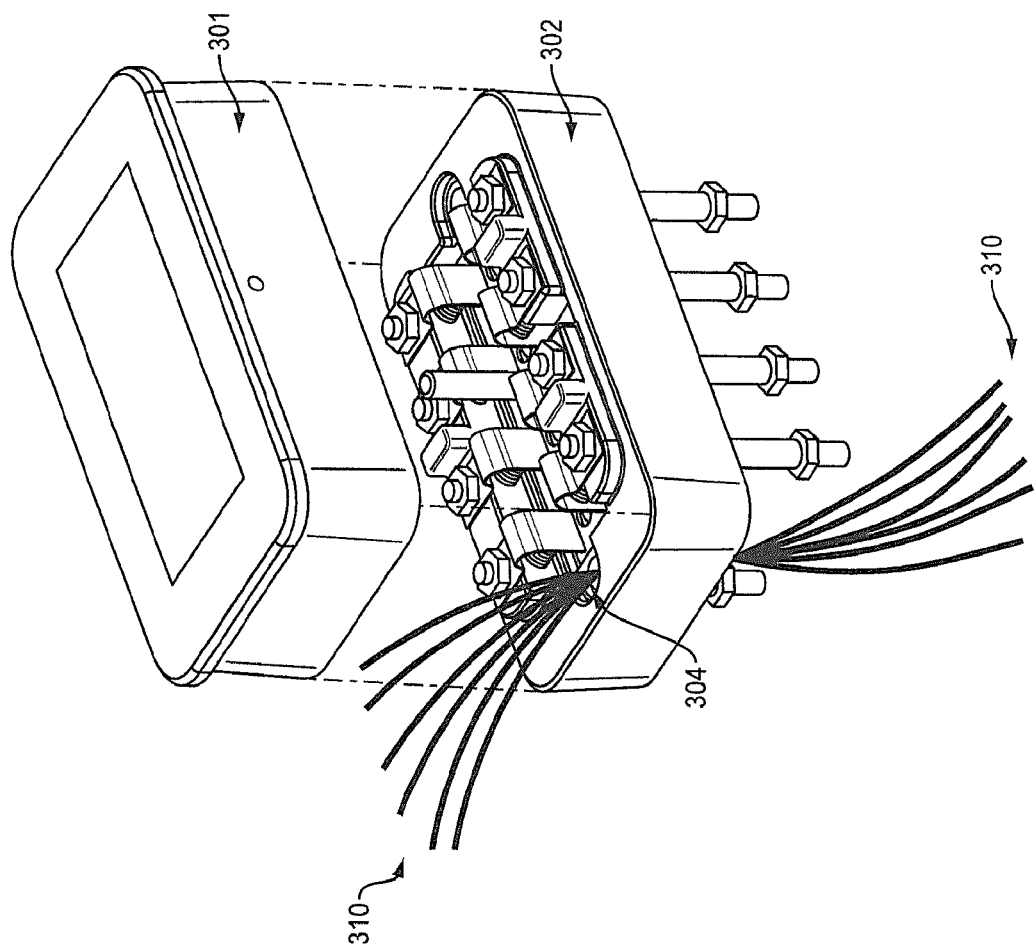
FIG. 8a illustrates the test block of FIG. 8, which is fitted with a mounting mechanism which provides a means to pass wires through such mechanism.

FIG. 8a illustrates the test block (302) of FIG. 8, which is fitted with a mounting mechanism (304) (similar to mounting mechanism 109, described herein) which provides a means to pass wires (310) through such mechanism.

Figure 9:
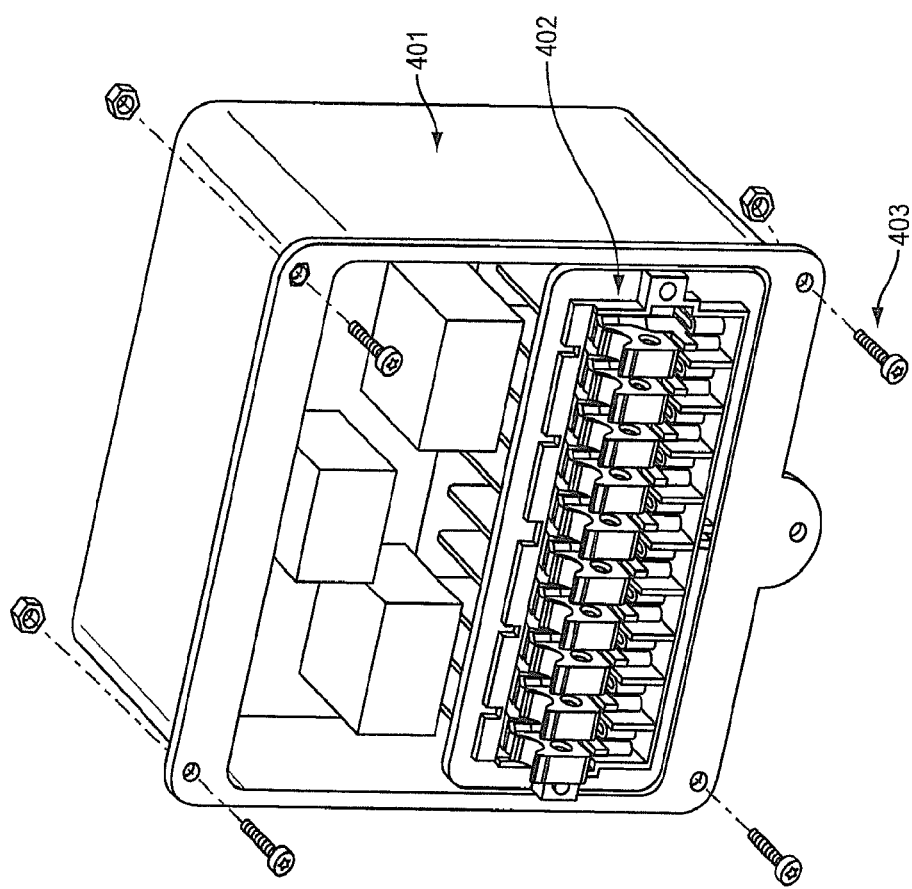
FIG. 9 illustrates a panel-mount device which contains a test switch and utilizes mounting mechanism which is not configured to pass wires from one side of the panel to the other.

FIG. 9 illustrates a panel-mount device (401) which contains a test switch (402) and utilizes mounting mechanism (403) which is not configured to pass wires from one side of the panel to the other. The panel-mount device (401) is the type of device as described in U.S. patent application Ser. No. 14/781,850. As such panel-mount device (401) contains a test switch (402) within its housing, such device thus also contains electrical signals which are also of interest to grid operators (as shown in FIG. 6) and users of panel-mount devices (401) can also achieve the benefits of the mounting recording devices to panels, without the need to drill one or more holes in the panel, when such panel-mount devices (401) are mounted to such panels with mounting mechanisms which provide a means for passing wires from one side of the panel to the other.

Figure 9A:
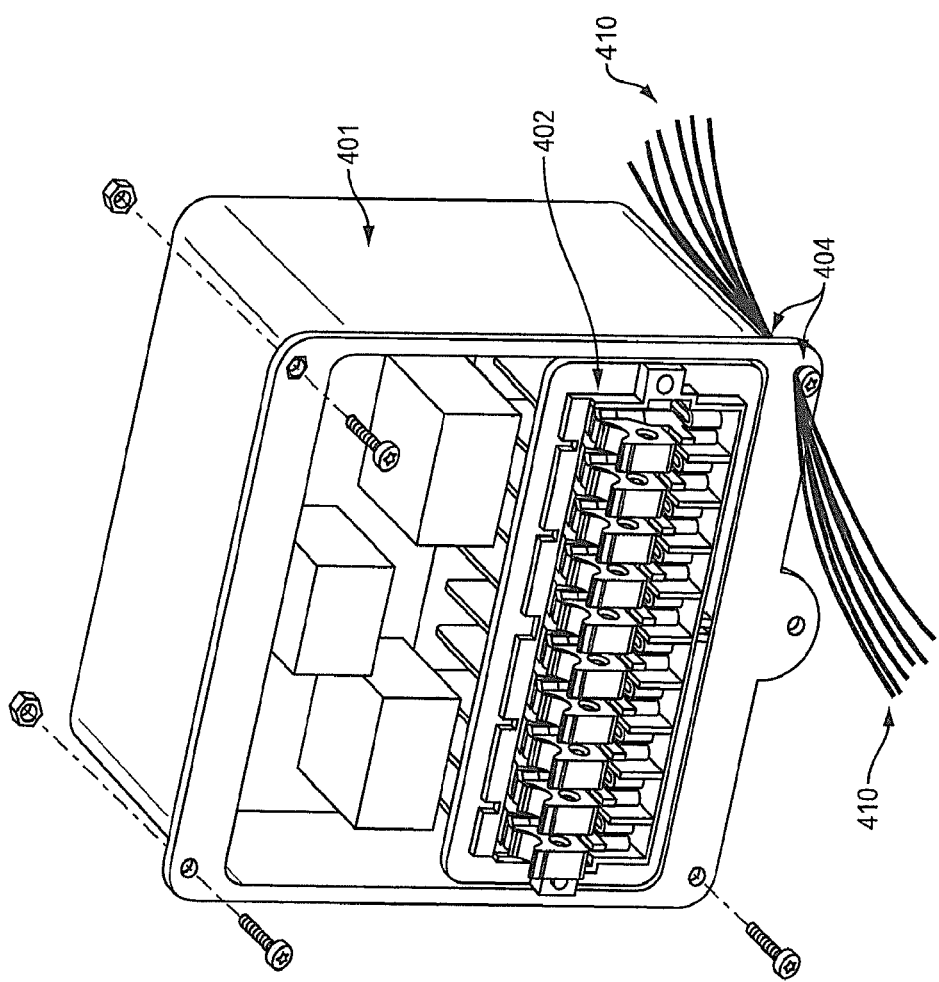
FIG. 9a illustrates the panel-mount device of FIG. 9 which contains a test switch and utilizes mounting mechanisms which allows wires to pass through such mechanisms.

FIG. 9a illustrates the panel-mount device (401) of FIG. 9 which contains a test switch (402) and utilizes mounting mechanisms (404) (similar to mounting mechanism 109, described herein) which allows wires (410) to pass through such mechanisms.

Figure 10:
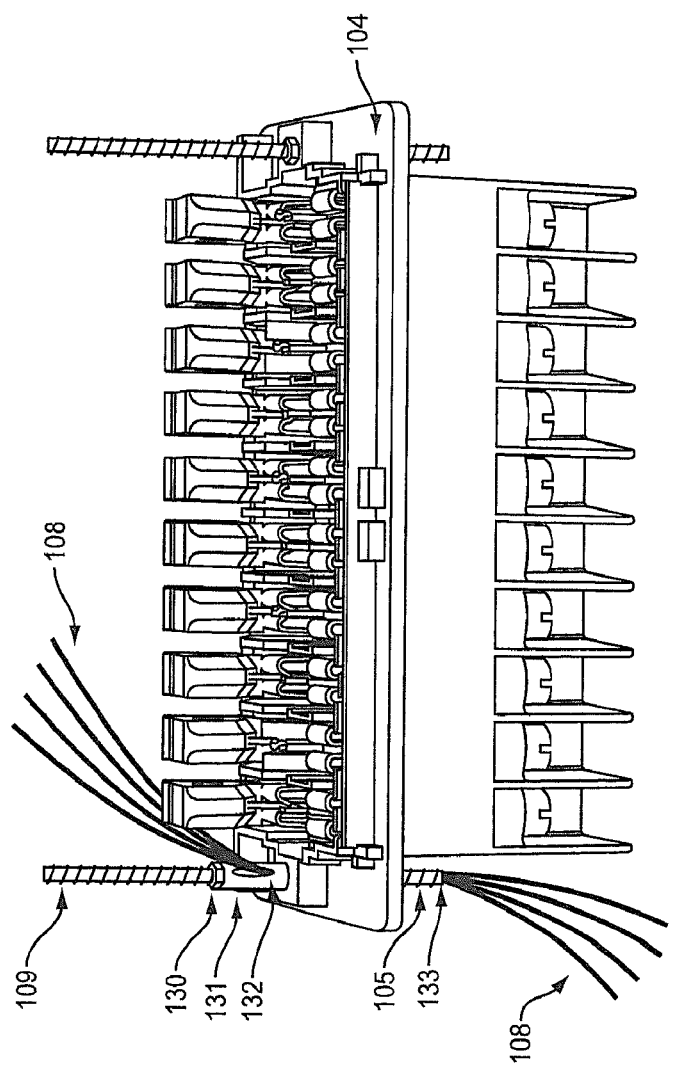
FIG. 10 illustrates one embodiment of a mounting mechanism being used on a test switch, whereby such mounting mechanism is configured to pass wires from one side of the panel to the other, in accordance with at least one embodiment of the invention.

FIG. 10 illustrates one embodiment of a mounting mechanism (109) being used on a test switch (104), whereby such mounting mechanism (109) is configured to pass wires from one side of the panel to the other, in accordance with at least one embodiment of the invention. This illustration shows the wires (108) which connect to a recording device (not shown) and then enter such mounting mechanism (109) through a port hole (145) within a wire-protecting sleeve (131) which is secured with a top-securing nut (130). The wires (108) exit such mounting mechanism (109) via a bottom wire exit hole (133) at bottom end of such mounting mechanism (109). From their origination, such wires (108) further connect to one or more devices or components such as transducers, power providing devices, computers, routers, servers, clocks, antennas, etc. (not shown).

Figure 11:
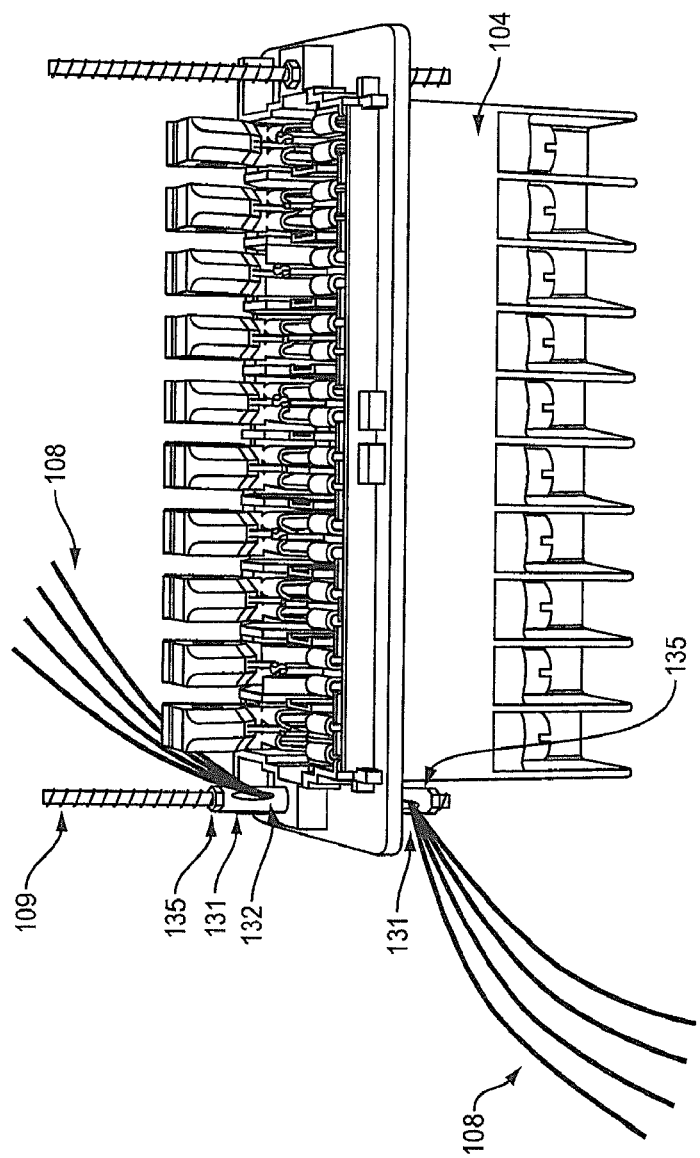
FIG. 11 illustrates another embodiment of mounting mechanism which is configured to pass wires from one side of a panel to the other, in accordance with at least one embodiment of the invention.

FIG. 11 illustrates another embodiment of mounting mechanism (109) which is configured to pass wires (108) from one side of a panel to the other, in accordance with at least one embodiment of the invention. Such mounting mechanism (109) utilizes a wire-protecting sleeve (131), containing a wire entering/exiting port hole (45), which is located at the rear portion of such mounting mechanism (109) and which is secured to a portion of such mechanism via bottom securing nuts (135).

FIG. 12 illustrates several embodiments of a mounting mechanism (herein referred to as mounting mechanism 109 for convenience) which each are configured to pass wires from one side of a panel to the other, in accordance with at least some embodiments of the invention. Each of the depicted embodiments of mounting mechanism 109 includes a top portion (142) and a bottom portion (143). Each of the depicted embodiments includes a wire-protection sleeve (131) on the portion of the mounting mechanism (109) which is located on or toward the "front" side of control panel. Such wire-protection sleeve (131) is configured to allow the wires to enter/exit the mounting mechanism (109) without being pinched or damaged by the securing nut (135). In some embodiments, the top wire-protection sleeve (131) installed on the front side of the control panel, and top securing nut (130) combine to comprise a sufficiently "low" height so as to allow for a sufficient number of available threads (on threaded shaft 113) which are necessary to adequately secure a cover or recording device (such as those as disclosed in U.S. patent application Ser. No. 14/781,850) to the test switch containing such mounting mechanism. In such application, it is also critical that the wire entry/exit hole, contained within the shaft (113) containing threads sufficiently align with the wire entry/exit hole within the wire-protecting sleeve (131).

The embodiments of the mounting mechanism illustrated in FIGS. 12b, 12c, 12d, 12h, and 12i each contain an integrated bottom mounting flange (161) which secures the bottom portion of the mounting mechanism to the rear side of the control panel. When employing such mounting flange (161), such mounting mechanism can be secured to the test switch without the need to install a bottom securing nut (as may be desirable while the test switch is in transit from the production factor to the substation location). In these cases, a bottom securing nut (135) will still be needed, but not until the test switch is actually mounted to the control panel.

The embodiments of the mounting mechanism illustrated in FIGS. 12a, 12b, 12c, 12d, 12e, and 12f each contain a bottom wire exit hole (136) which is located on the side-bottom portion of the mounting mechanism (109) allowing for the bottom threads of the shaft (113) to be used for future purposes even after the device which utilizes such mounting mechanism is fully installed.

The embodiments of the mounting mechanism illustrated in FIGS. 12g, 12h, 12i, and 12j each contain a bottom wire exit hole (133) which is located on at the bottom end of the mounting mechanism (109). Such embodiments do not require the use of bottom wire-protecting sleeves which reduces the cost of such mounting mechanism and also helps to simplify the installation process (with one less piece to install).

The embodiments of the mounting mechanism illustrated in FIGS. 12c, 12d, 12e, 12f, 12i, and 12j show smoothed portions (138) of the threaded shaft (113) which, when utilized, serve to minimize the amount of sharp edges which are common with metal threads (such as the type typically used to secure test switches to control panels) and which can cause installers of such test switches to inadvertently nick or damage the insulation on the wires which pass through such mechanism.

The embodiments of the mounting mechanism illustrated in FIGS. 12a, 12b, 12g, and 12h do not contain smoothed portions on the threaded rod which saves in manufacturing cost of the mounting mechanism, but at the risk of creating additional sharp edges on threads which might cause installers of such test switches to inadvertently nick or damage the insulation on the wires which pass through such mechanism.

FIG. 13 illustrates an exemplary embodiment of a mounting mechanism (109) which is configured to pass wires from one side of a panel to the other, in accordance with at least one embodiment of the invention. In FIG. 13, mounting mechanism (109) includes a wire-protection sleeve (131) positionable on each of the two surfaces or sides of the control panel. These wire-protecting sleeves (131) prevent the wires from being pinched or damaged by the securing nut (e.g., securing nuts 130, 135) when such securing nut is tightened onto the mating threads. Such tightening of the securing nut is necessary in order to securely attach the test switch (or base) to the control panel and/or to secure the mounting mechanism to the test switch (or base).

FIGS. 14A-14B illustrate an exemplary mounting mechanism (109) in accordance with at least one embodiment of the invention. FIGS. 14A-14B depicts dimensions and constraints of the inner portion of one embodiment of a mounting mechanism (109) which is configured to pass wires from one side of a panel to the other.

DIM A shows the vertical dimension of the mounting flange (161) which, in some embodiments, must be sufficiently small to pass through an existing control panel test switch cutout (typically 0.250 inches in the area of the mounting mechanism). A vertical dimension larger than 0.250 inches would prevent the mounting mechanism from being able to be installed onto such pre-installed control panel mounted test switch, in some embodiments. One embodiment may have such dimension be 0.230 inches.

DIM B represents the horizontal dimension of the mounting flange (161) which must be sufficiently large to prevent the threaded portion of the mounting mechanism from rotating while either of the top or bottom securing nut is being tightened, in some embodiments. However, this DIM B must also be sufficiently small to lodge within the flange cutouts which exist in typical test switches which are already installed throughout the grid, in some embodiments. One embodiment may have such dimension be 0.270 inches.

DIM I represents the threaded portion of the mounting mechanism 109 which contains the threads which mate to the mounting thumbscrews which can be integral to typical test switches and data recording devices. In some embodiments, this length of this DIM I should be sufficiently long to provide a sufficient number of threads (to adequately secure the mating thumbscrew) but also not be excessively long to provide a hazard to human personnel (including to unprotected eyes) who routinely pass by in the vicinity of the front portion of installed test switches in control rooms throughout the grid.

DIM L and M represent the dimensions of the wire port holes (e.g., port holes 132 and 136 in FIGS. 12*a-j*). In some embodiments, the width of the port hole must be sufficiently large to allow one or more insulated wires to pass through the mounting mechanism and into/out of the port hole. However, in some embodiments, this DIM M and L must also be sufficiently small to provide the necessary strength to prevent the mounting mechanism from being damaged (via bending) during normal handling and/or torqueing of the top and bottom securing nuts during installation. For example, in some embodiments, the width of the port hole may be between 0.1 and 0.2 inches and the height may be between 0.15 and 0.3 inches. In some embodiments, the dimensions of these two wire port holes are 0.120 inches wide (horizontal direction) and 0.220 inches in the vertical direction.

DIM H represents the outer diameter of the section of the mounting mechanism (109) which contains the wire port holes (e.g., port holes 132 and 136 in FIGS. 12*a-j*) (and through-hole down the inner vertical centerline of the mounting mechanism 109). In some embodiments, this outer diameter dimension must be sufficiently large to contain the inner through hole, however, must also be small enough to pass through an existing mounting hole in a test switch. One embodiment may have such dimension be 0.019 inches.

Figure 15:
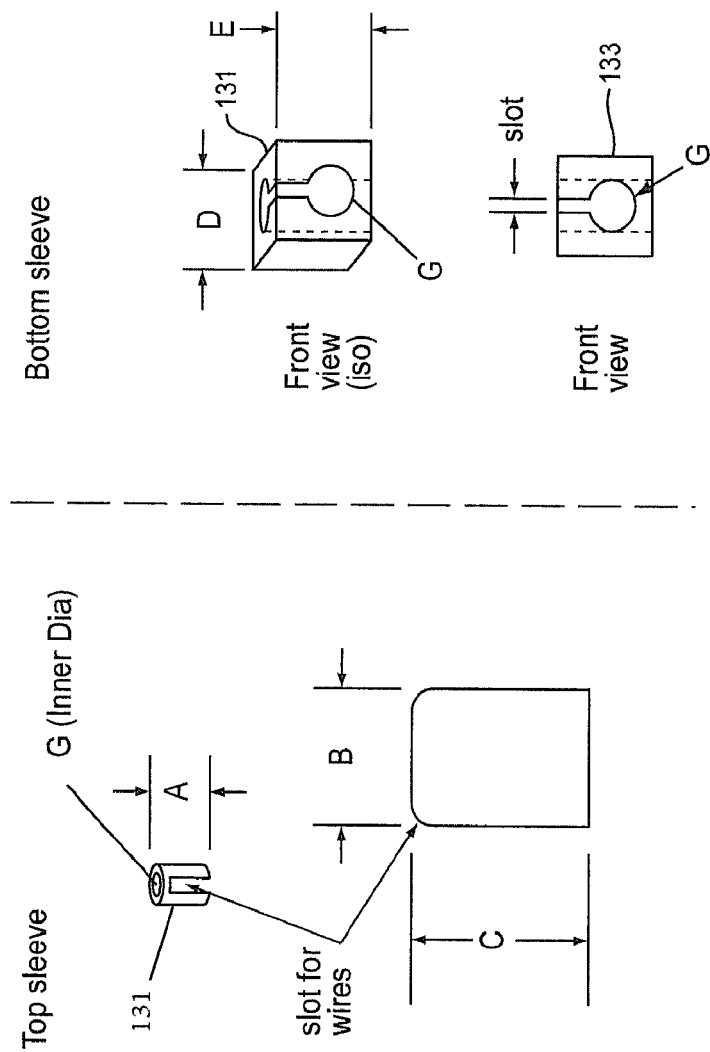
FIG. 15 shows embodiments of the top and bottom wire protecting sleeves which may be used in conjunction with the inner portion of a mounting mechanism as shown in FIG. 14A.

FIG. 15 shows embodiments of the top and bottom wire protecting sleeves (131) which may be used in conjunction with the inner portion of a mounting mechanism (109) as shown in FIG. 14A.

DIM A represents the vertical dimension of the wire protecting sleeve (131) which, in some embodiments, must be sufficiently large for mechanical strength while allowing one or more insulated wires to pass and must also extend into the threaded portion of the inner portion of the mounting mechanism so as to allow the top securing nut to firmly secure this sleeve onto the top portion of the test switch base. However, in some embodiments, this DIM A must also be sufficiently small so as to avoid mechanically touching the mounting thumbscrews which are used to secure a test switch cover or data recording device to such mounting mechanism. One embodiment may have this dimension be 0.500 inches.

DIM B and C represent the dimensions of the wire port hole (or slot) which, in some embodiments, must mechanically align with Dimension L of FIG. 14. In some embodiments, the width (Dim B) and height (DIM C) of this hole or slot must be sufficiently large to allow one or more insulated wires to pass through the mounting mechanism and into/out of the port hole/slot. One embodiment may have such dimensions of the width of this wire passing port be 0.120 inches. One embodiment may have the dimension of the height of this wire passing port be 0.220 inches.

DIM G represents the inner diameter of the sleeves which, in some embodiments, must be sufficiently large to easily slide down (as a sleeve) over the inner portion of the mounting mechanism and to allow the passage of one or more wires out the side of the bottom mounting sleeve, while, also being of sufficiently small size so as to provide sufficient strength of the surrounding material in order to avoid damage during normal handling and/or during the torqueing of either the top or bottom securing nut during installation. One embodiment may have such dimension G be 0.220 inches.

DIM D represents the horizontal thickness of the bottom sleeve which, in some embodiments, must be sufficiently large to accommodate the passing of the inner portion of the mounting mechanism which also not protruding past the left/right horizontal edge a typical test switch base. In some embodiments, such protrusion could otherwise cause mechanical interference with adjacent equipment which might be installed on the same control panel as is the test switch.

DIM E represents the vertical height of the bottom sleeve which, in some embodiments, must be sufficiently large to accommodate the wire-passing port pass and must also extend into the threaded portion of the inner portion of the mounting mechanism so as to allow the bottom securing nut to firmly secure this sleeve against the rear portion of the control panel, however this DIM E must also be sufficiently small so as to avoid mechanical interference with other equipment (including wiring) which might exist behind the control panel in the same vicinity as the test switch.

Figure 16:
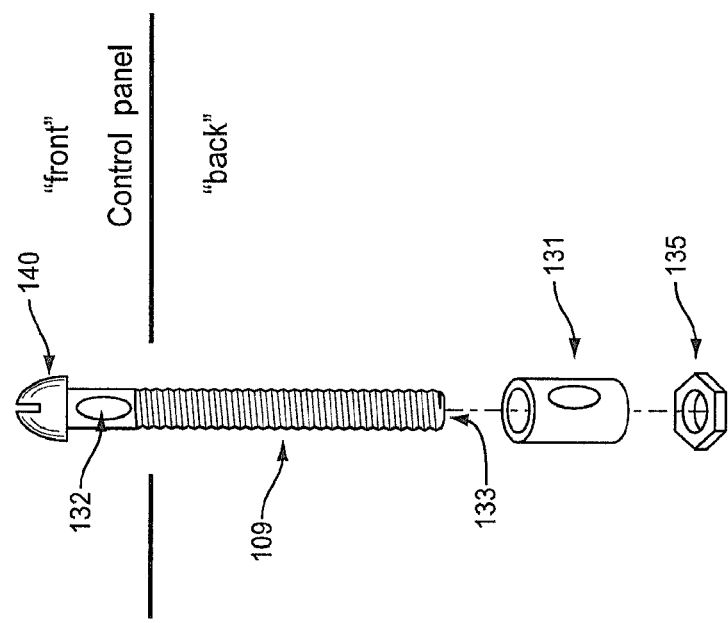
FIG. 16 illustrates an embodiment of a mounting mechanism, in accordance with at least one embodiment of the invention.

FIG. 16 illustrates an embodiment of a mounting mechanism (109) which is configured to pass wires from one side of the panel to the other and which may be used to mount test blocks to control panels such as the test blocks and devices as described in U.S. patent application Ser. No. 14/781,850 and incorporated herein by reference in its entirety). FIG. 16 includes a cap 140 on a top portion of the mounting mechanism (109) that prevents wires from passing through the top portion of the mounting mechanism (109). In FIG. 16, wires pass through wire protecting sleeve 131 and bottom wire exit hole 133 on a bottom portion of the mounting mechanism (109) to port hole (132) at a top portion of the mounting mechanism (109).

Figure 17:
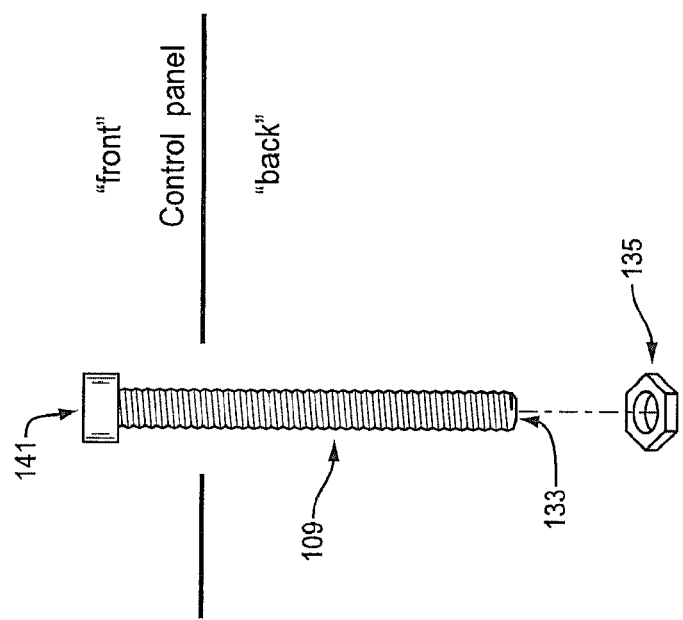
FIG. 17 is an alternative embodiment of mounting mechanism as shown in FIG. 16, in accordance with at least one embodiment of the invention.

FIG. 17 is an alternative embodiment of mounting mechanism (109) as shown in FIG. 16, in accordance with at least one embodiment of the invention. The mounting mechanism (109) in FIG. 17 is similar to the mounting mechanism (109) in FIG. 16, however, FIG. 17 depicts a mounting mechanism (109) with one of the wire port holes (141) on the top portion of the mounting mechanism.

In some embodiments, a step-by-step procedure for retrofitting a test switch mounting mechanism (109) (onto a test switch 101 which is already installed onto a control panel 103) with one embodiment of a mounting mechanism which provides a means for wires to pass from one side of a panel to the other, is as follows:

1. Remove existing mounting bolt from test switch:
2. Remove (and set aside) existing cover or recording device by rotating thumbscrews counter-clockwise (2 places).
3. On each side of test switch (2 places), remove top securing nut by rotating counter-clockwise (using a wrench tool).
4. Carefully pull test switch away from front of control panel (approximately 0.500 inches.
5. Using bolt cutters, slide bolt cutter along front surface of control panel and cut existing mounting bolts into two pieces (making cut just behind bolt mounting flange).

6. Remove (and discard) both pieces of existing mounting bolts.
7. Installing a mounting mechanism which provides a means to pass wires from one side of a panel to the other:
8. From back of control panel, slide threaded portion of mounting mechanism through both the existing panel mounting cutout as well as through the existing mounting hole in the installed test switch.
9. Feed wires through the wire entry/exit port holes (from one side of control panel to the other).
10. Slide top and bottom wire-protecting sleeves onto top and bottom of threaded portion of mounting mechanism. Carefully feed wires through the slots in each of the two sleeves taking care not to nick, pinch, or damage the insulation on any wire.
11. Attach top and bottom securing nuts onto top and bottom portions of the mounting mechanism by rotating each in a clockwise direction (using a wrench tool). Ensure sufficient torque to securely hold nuts in place, while not overtorquing (which could cause damage to the mechanical components).
12. On the front side of the control panel, connect wires to recording device per manufacturer's instructions.
13. On the rear side of the control panel, connect wires to auxiliary equipment and devices per manufacturer's instructions.

In some embodiments, installing a mounting mechanism (109), which is configured to pass wires from one side of a panel to the other, onto a test switch (101) which has not yet been installed onto a control panel (103) is as follows:

1. If already installed onto test switch, remove existing mounting mechanism by rotating the top (and bottom, if fitted) securing net counter-clockwise (using a wrench tool). Remove and discard.
2. From back of test switch, slide threaded portion of mounting mechanism through the existing mounting hole in the test switch.
3. Feed wires through the wire entry/exit port holes (from front of Test switch to rear of test switch).
4. Slide top and bottom wire-protecting sleeves onto top and bottom of threaded portion of mounting mechanism. Carefully feed wires through the slots in each of the two sleeves taking care not to nick, pinch, or damage the insulation on any wire. (this step 4 and step 3 may be performed in any order).
5. Attach top securing nut onto top portion of the mounting mechanism by rotating in a clockwise direction (using a wrench tool). Ensure sufficient torque to securely hold nut in place, while not over-torqueing (which could cause damage to the mechanical components). Attaching bottom securing nut (required for later installation onto a control panel) is optional at this point.
6. Terminate wires with connectors (if desired).

In some embodiments, a typical retrofit kit for the step-by-step procedure, as described above, would include:

1. An inner threaded portion
2. Top wire-protecting sleeve
3. Bottom wire-protecting sleeve
4. Top securing nut (optional, as technician could reuse existing top securing nut from existing test switch installation)
5. Bottom securing nut (optional, as technician could reuse bottom existing securing nut from existing test switch installation)
6. Wires (optional, as wires can be installed at a later date and/or wires can be of technician's choosing, provided such wires are small enough to pass through the port holes contained within the mounting mechanism and which meet equipment manufacturer's requirements).

The use of an enhanced mounting mechanism (with is capable of safely and reliably passing electrical wires from one surface of a control panel to the other) can advantageously make use of existing test switch and test block mounting holes when installing a recording device onto a control panel. This results in eliminating the need for cutting one or more holes in the control panel (which would otherwise be needed if panel-mount connectors were used to pass such electrical wires) and thus saving time and cost, and significantly reducing the electrical hazard as associated with small metal shavings near live electrical circuits which are typically created when cutting holes in control panels.

Additional Embodiments

In some embodiments, a mounting mechanism may comprise a first end and a second end. For example, in FIGS. 12a-12j, mounting mechanism (109) comprises a top portion (142) corresponding to a first end and a bottom portion (143) corresponding to a second end.

In some embodiments, the mounting mechanism may comprise a shaft extending from the first end to the second end. For example, in FIGS. 12a-12j, mounting mechanism (109) comprises a shaft 113 that extends from the top portion (142) to the bottom portion (143).

In some embodiments, the shaft may include a peripheral wall with threading extending along at least a portion of the peripheral wall of the shaft. For example, in FIGS. 12a-12j, shaft 113 includes a peripheral wall with threading 144 extending along the peripheral wall.

The shaft may include a first port hole opening and a second port hole opening. In some embodiments, the first port hole opening is positioned on the peripheral wall of the shaft. For example, in FIG. 12a, port hole 132, corresponding to the first port hole opening, is positioned on the peripheral wall of the shaft 113. In some embodiments, the first port hole opening has a minimum dimensional distance between about 0.120 inches and about 0.220 inches. In some embodiments, the first port hole opening is positioned at one of: the first end and the second end. For example, in FIG. 12j, bottom wire exit hole 133, corresponding to the first port hole opening, is positioned at the bottom portion 143 of mounting mechanism 109.

In some embodiments, the shaft may include a through-hole extending from the first port hole opening to the second port hole opening to provide a via for wiring to pass within the shaft from the first port hole opening to the second port hole opening. For example, in FIG. 12a, mounting mechanism 109 includes a through-hole extending from port hole 132, corresponding to a first port hole, and port hole 136, corresponding to a second port hole.

In some embodiments, the mounting mechanism comprises a wire-protection sleeve positionable at the first port hole opening, the wire-protection sleeve including an opening alignable with the first port hole opening to provide a via for the wiring to pass through the wire-protection sleeve while protecting the wiring from being pinched or damaged. For example, in FIG. 12a, mounting mechanism 109 includes a wire-protection sleeve 131 with an opening 145 that aligns with port hole 132.

In some embodiments, the wire-protection sleeve has a dimensional distance, as measured vertically along the centerline of the shaft, of less than about 0.5 inches.

In some embodiments, the mounting mechanism comprises a securing nut connectable to the shaft. For example, in FIG. 12a, mounting mechanism 109 includes a securing nut 135.

In some embodiments, the mounting mechanism is configured to mount a test switch base to a control panel, the test switch base containing one or more knife blade style switches that electrically connect a first electrical component to a second electrical component.

In some embodiments, the mounting mechanism is configured to mount a recording device to the test switch base, the test switch recording device being configured to record electrical signals that pass through the one or more knife blade style switches.

In some embodiments, the mounting mechanism is configured to mount a testing device to a control panel, the testing device being configured to contain a test switch base, the test switch base being configured to contain one or more knife blade style switches that electrically connect a first electrical component to a second electrical component.

In some embodiments, the mounting mechanism is configured to mount a recording device to the device, the test switch recording device being configured to record electrical signals that pass through the one or more knife blade style switches.

In some embodiments, the mounting mechanism mounts a test block base to a control panel, the test block base including one or more metal contacts that electrically connect a first electrical component to a second electrical component.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and features of the disclosed embodiments may be combined. Unless specifically set forth herein, the terms "a", "an" and "the" are not limited to one element but instead should be read as meaning "at least one". As used herein, the term "about" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A mounting mechanism comprising:
a first end and a second end; and
a shaft extending from the first end to the second end, the shaft including:
  a peripheral wall;
  threading extending along at least a portion of the peripheral wall of the shaft;
  a first port hole opening positioned on the peripheral wall of the shaft and a second port hole opening;
  a through-hole extending from the first port hole opening to the second port hole opening to provide a via for wiring to pass within the shaft from the first port hole opening to the second port hole opening; and
a wire-protection sleeve positionable at the first port hole opening, the wire-protection sleeve including an opening alignable with the first port hole opening to provide a via for the wiring to pass through the wire-protection sleeve while protecting the wiring from being pinched or damaged wherein,
the wire-protection sleeve has a dimensional distance, as measured vertically along the centerline of the shaft, of less than about 0.5 inches.

2. The mounting mechanism of claim 1, wherein the first port hole opening has a minimum dimensional distance between about 0.120 inches and about 0.220 inches.

3. The mounting mechanism of claim 1, wherein the first port hole opening is positioned at one of: the first end and the second end.

4. The mounting mechanism of claim 1, further comprising:
a securing nut connectable to the shaft.

5. A mounting mechanism for use with a test switch base, a control panel, and a recording device, the mounting mechanism comprising:
a first end and a second end; and
a shaft extending from the first end to the second end, the shaft including:
  a peripheral wall;
  threading extending along at least a portion of the peripheral wall of the shaft;
  a first port hole opening positioned on the peripheral wall of the shaft and a second port hole opening;
  a through-hole extending from the first port hole opening to the second port hole opening to provide a via for wiring to pass within the shaft from the first port hole opening to the second port hole opening; and
a wire-protection sleeve positionable at the first port hole opening, the wire-protection sleeve including an opening alignable with the first port hole opening to provide a via for the wiring to pass through the wire-protection sleeve while protecting the wiring from being pinched or damaged wherein,
the wire-protection sleeve has a dimensional distance, as measured vertically along the centerline of the shaft, of less than about 0.5 inches, wherein
the mounting mechanism is configured to mount a test switch base to a control panel, the test switch base containing one or more knife blade style switches that electrically connect a first electrical component to a second electrical component.

6. The mounting mechanism of claim 5, wherein the mounting mechanism is configured to mount a recording device to the test switch base, the test switch recording device being configured to record electrical signals that pass through the one or more knife blade style switches.

7. A mounting mechanism for use with a testing device, a control panel and a recording device, the mounting mechanism comprising:
　a first end and a second end; and
　a shaft extending from the first end to the second end, the shaft including:
　　a peripheral wall;
　　threading extending along at least a portion of the peripheral wall of the shaft;
　　a first port hole opening positioned on the peripheral wall of the shaft and a second port hole opening;
　　a through-hole extending from the first port hole opening to the second port hole opening to provide a via for wiring to pass within the shaft from the first port hole opening to the second port hole opening; and
　a wire-protection sleeve positionable at the first port hole opening, the wire-protection sleeve including an opening alignable with the first port hole opening to provide a via for the wiring to pass through the wire-protection sleeve while protecting the wiring from being pinched or damaged wherein,
　the wire-protection sleeve has a dimensional distance, as measured vertically along the centerline of the shaft, of less than about 0.5 inches, wherein
　the mounting mechanism is configured to mount a testing device to a control panel, the testing device being configured to contain a test switch base, the test switch base being configured to contain one or more knife blade style switches that electrically connect a first electrical component to a second electrical component.

8. The mounting mechanism of claim 7, wherein
　the mounting mechanism is configured to mount a recording device to the control panel, the test switch base being configured to record electrical signals that pass through the one or more knife blade style switches.

9. A mounting mechanism for use with a test block base and a control pane, the mounting mechanism comprising:
　a first end and a second end; and
　a shaft extending from the first end to the second end, the shaft including:
　　a peripheral wall;
　　threading extending along at least a portion of the peripheral wall of the shaft;
　　a first port hole opening positioned on the peripheral wall of the shaft and a second port hole opening;
　　a through-hole extending from the first port hole opening to the second port hole opening to provide a via for wiring to pass within the shaft from the first port hole opening to the second port hole opening; and
　a wire-protection sleeve positionable at the first port hole opening, the wire-protection sleeve including an opening alignable with the first port hole opening to provide a via for the wiring to pass through the wire-protection sleeve while protecting the wiring from being pinched or damaged wherein,
　the wire-protection sleeve has a dimensional distance, as measured vertically along the centerline of the shaft, of less than about 0.5 inches, wherein
　the mounting mechanism mounts a test block base to a control panel, the test block base including one or more metal contacts that electrically connect a first electrical component to a second electrical component.

\* \* \* \* \*